(12) United States Patent
Jiang et al.

(10) Patent No.: US 6,995,442 B2
(45) Date of Patent: Feb. 7, 2006

(54) TOTAL INTERNAL REFLECTION (TIR) CMOS IMAGER

(75) Inventors: Tongbi Jiang, Boise, ID (US); Michael Connell, Boise, ID (US); Jin Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/757,589

(22) Filed: Jan. 15, 2004

(65) Prior Publication Data

US 2004/0227170 A1 Nov. 18, 2004

Related U.S. Application Data

(62) Division of application No. 10/373,785, filed on Feb. 27, 2003.

(51) Int. Cl.
*H01L 31/0232* (2006.01)
*H01L 21/00* (2006.01)

(52) U.S. Cl. .............. 257/432; 257/434; 257/435; 257/436; 438/48; 438/64; 438/65

(58) Field of Classification Search ........ 257/291–294, 257/432–436, 222, 232, 233; 438/48, 64, 438/65, 69–70
See application file for complete search history.

(56) References Cited

U.S. PATENT DOCUMENTS 5,910,940 A 6/1999 Guerra

| | | | |
|---|---|---|---|
| 6,271,900 B1 | 8/2001 | Li | |
| 2002/0122209 A1 | 9/2002 | Yoshida | |
| 2003/0122209 A1* | 7/2003 | Uya | 257/435 |
| 2003/0136759 A1* | 7/2003 | Mikolas | 216/26 |
| 2004/0082094 A1 | 4/2004 | Yamamoto | |

OTHER PUBLICATIONS

Reed, et al., "Fabrication of microchannels using polycarbonates as sacrificial materials", J. Micromech. Microeng. 11:733-737 (2001).
Bhusari et al., "Fabrication of Air-Channel Structures for Microfluidic, Microelectromechanical, and Microelectronic Applications," J. Microelectr. Systems 10(3): 400-408, (2001).

* cited by examiner

*Primary Examiner*—Donghee Kang
(74) *Attorney, Agent, or Firm*—Dickstein Shapiro Morin & Oshinsky LLP

(57) ABSTRACT

The subject invention is directed to use of photoconductors as conductors of light to photo diodes in a CMOS chip, wherein said photoconductors are separated by at least one low refractive index material (i.e. air). The present invention offers advantages over previous CMOS imaging technology, including enhanced light transmission to photo diodes. The instant methods for producing a CMOS imaging device and CMOS imager system involve minimal power loss. Since no lens is required, the invention eliminates concerns about radius limitation and about damaging lenses during die attach, backgrind, and mount. The invention also provides little or no cross talk between photo diodes.

40 Claims, 10 Drawing Sheets

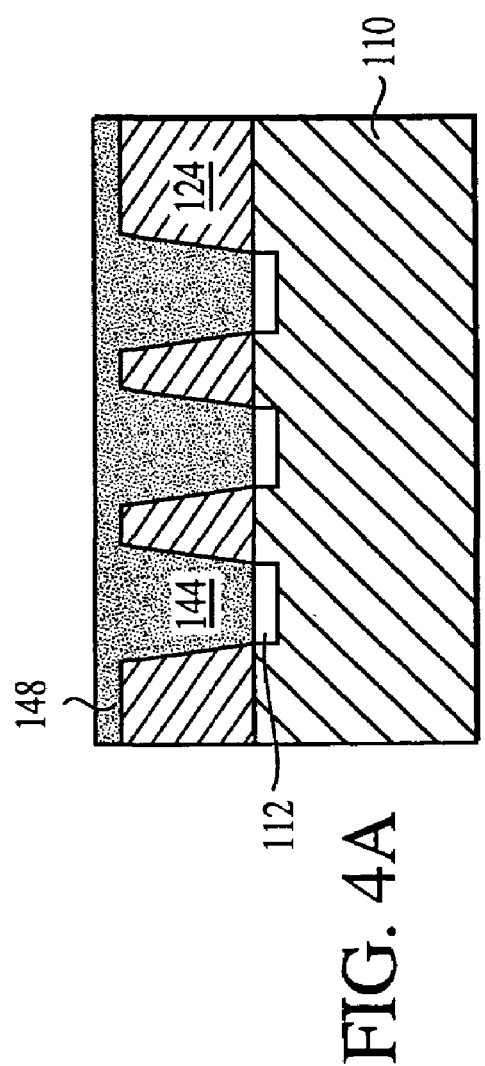
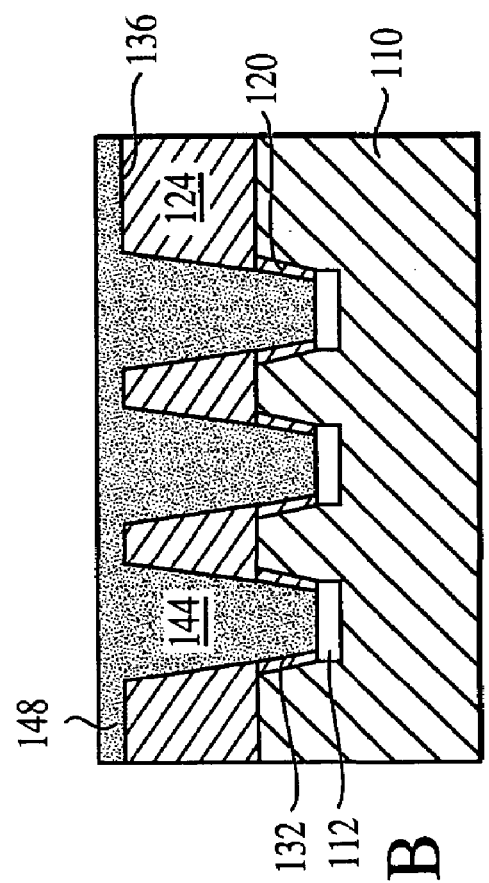
FIG. 4A
FIG. 4B

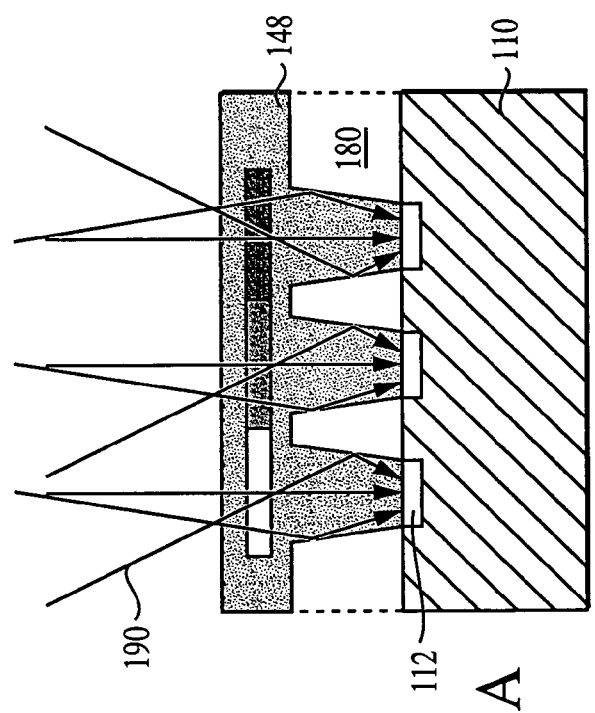
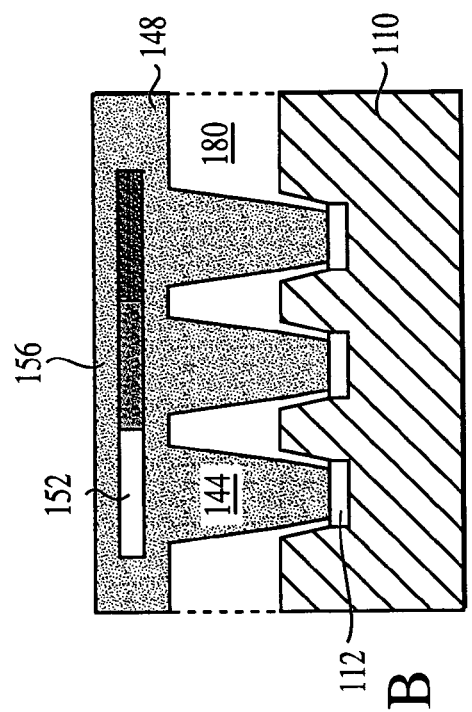
FIG. 9A
FIG. 9B

TOTAL INTERNAL REFLECTION (TIR) CMOS IMAGER

This application is a divisional of application Ser. No. 10/373,785, filed on Feb. 27, 2003, which is incorporated herein by reference.

FIELD OF THE INVENTION

The present invention relates to use of glass conductors as conductors of light to photo diodes in a CMOS chip, wherein said glass conductors are separated by at least one low refractive index material.

BACKGROUND OF THE INVENTION

There are a number of different types of semiconductor-based imagers, including charge coupled devices (CCDs), photo diode arrays, charge injection devices and hybrid focal plane arrays. CCDs are often employed for image acquisition for small size imaging applications. CCDs are also capable of large formats with small pixel size and they employ low noise charge domain processing techniques. However, CCD imagers have a number of disadvantages. For example, they are susceptible to radiation damage, they exhibit destructive read out over time, they require good light shielding to avoid image smear and they have a high power dissipation for large arrays.

Because of the inherent limitations in CCD technology, there is an interest in complementary metal oxide semiconductor (CMOS) imagers for possible use as low cost imaging devices. A fully compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

A CMOS imager circuit includes a focal plane array of pixel cells, each one of the cells including either a photo diode, a photogate or a photoconductor overlying a doped region of a substrate for accumulating photo-generated charge in the underlying portion of the substrate.

In a conventional CMOS imager, the active elements of a pixel cell perform the necessary functions of: (1) photon to charge conversion; (2) accumulation of image charge; (3) transfer of charge to a floating diffusion node accompanied by charge amplification; (4) resetting the floating diffusion node to a known state before the transfer of charge to it; (5) selection of a pixel for readout; and (6) output and amplification of a signal representing pixel charge. The charge at the floating diffusion node is typically converted to a pixel output voltage by a source follower output transistor. The photosensitive element of a CMOS imager pixel is typically either a depleted p-n junction photo diode or a field induced depletion region beneath a photogate. For photo diodes, image lag can be eliminated by completely depleting the photo diode upon readout.

CMOS imagers have a number of advantages, including for example low voltage operation and low power consumption. CMOS imagers are also compatible with integrated on-chip electronics (control logic and timing, image processing, and signal conditioning such as A/D conversion); CMOS imagers allow random access to the image data; and CMOS imagers have lower fabrication costs as compared with the conventional CCD since standard CMOS processing techniques can be used. Additionally, low power consumption is achieved for CMOS imagers because only one row of pixels at a time needs to be active during readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

With the need for enhanced resolution and a higher level of integration of an image array with associated processing circuit using CMOS imaging devices, there is a need for improving the characteristics of CMOS image arrays. As such, it would be beneficial to minimize if not eliminate the loss of light transmitted to pixel arrays during image acquisition. Enhanced light transmission upon pixel arrays is one means to enhance the image processing and imaging capabilities of CMOS chip devices. These enhancements in CMOS imagers have many applications, including use as imagers in color cameras.

Accordingly, there is needed an improved CMOS imaging device capable of receiving and propagating light to photo diodes with minimal loss of light transmission to the photo diodes. There is also needed an improved method for fabricating CMOS imaging devices, in which there is a high level of transmission of light to photo diodes and that reduces the drawbacks in CMOS imaging of the prior art. Methods of fabricating a pixel array exhibiting these improvements are also needed.

SUMMARY OF THE INVENTION

Embodiments of the present invention provide a CMOS imaging device, an image pixel array in a CMOS imaging device, and a CMOS imager system having improved characteristics for reception of light by photoconductors and transmission of this light to photo diodes. This enhanced reception of light by photoconductors is achieved by fabricating the photoconductors using one or more materials having a refractive index greater than air. The photoconductors of the present invention are formed as individual units operable to transmit or propagate light directly to corresponding individual photo diodes. Also provided are methods for forming a CMOS imaging device, in accordance with embodiments of the present invention, comprising forming photoconductor arrays and at least one fluidic material in the intervening spaces between individual photoconductor units, wherein the fluidic material has a lower refractive index than the refractive index of the surrounding photoconductors.

In another embodiment of the invention, a method of fabricating a photoconductor array in a CMOS imaging device includes forming a plurality of photo diodes at or beneath the upper surface of a semiconductor substrate; exposing the upper surface of each of the photo diodes; forming a sacrificial layer over the photo diodes; removing at least a portion of said sacrificial layer to expose an opening over each of the photo diodes; forming a photoconductor over each photo diode; forming a color filter layer with an individual color filter over said each photo diode; forming a photoconductive layer over the color filter layer; and removing the sacrificial layer surrounding each photoconductor, where at least one fluidic material remains between each photoconductor, the fluidic material having a lower refractive index as compared to the refractive index of each photoconductor.

These and other features and advantages of the invention will be more apparent from the following detailed description that is provided in connection with the accompanying drawings and illustrated exemplary embodiments of the invention.

BRIEF DESCRIPTION OF THE DRAWINGS

FIG. 4 depicts a schematic cross-sectional view of the FIG. 1 device formed at a stage of processing subsequent to that shown in FIG. 3.

FIG. 9 depicts a schematic cross-sectional view of the FIG. 1 device formed at a stage of processing subsequent to that shown in FIG. 8.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural and logical changes may be made without departing from the spirit or scope of the present invention.

The terms "substrate" and "wafer" can be used interchangeably in the following description and may include any semiconductor-based structure. The structure should be understood to include silicon, silicon-on insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to the substrate in the following description, previous process steps may have been utilized to form regions or junctions in or over the base semiconductor or foundation.

The term "metal" is intended to include not only elemental metal, but can include metal with other trace metals or in various alloyed combinations with other metals as known in the semiconductor art, as long as such alloy retains the physical and chemical properties of a metal. The term "metal" is also intended to include conductive oxides of such metals.

The term "pixel" refers to a discrete picture element unit cell containing a photoconductor and transistors for converting electromagnetic radiation to an electrical signal. For purposes of illustration, a representative photoconductor is illustrated in the figures and description herein. An array or combination of photoconductors together comprise a photoconductor array for use in a CMOS imager device. Typically, fabrication of all photoconductor arrays in an imager will proceed simultaneously in a similar fashion.

The term "sacrificial materials" refers to any material, for example, polynorbornene or polycarbonate based materials, that can readily decompose into volatile products when heated.

Figure 1A:
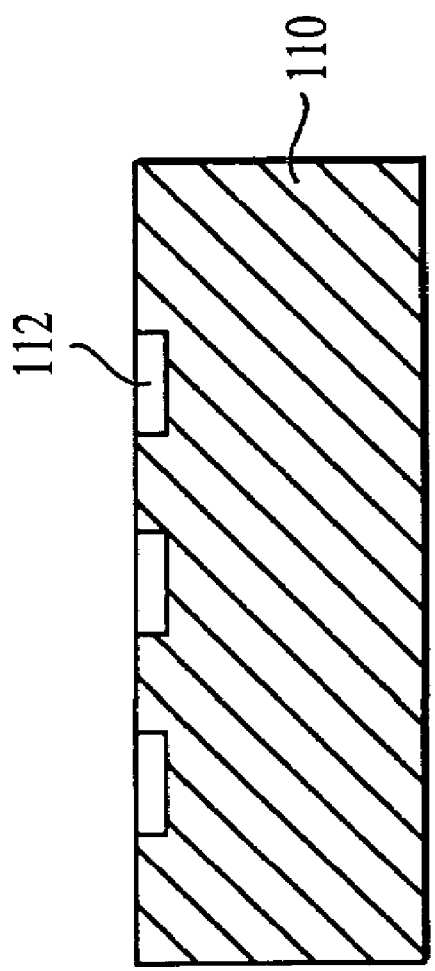
FIG. 1 depicts a schematic cross-sectional view of a portion of a CMOS chip device prior to the formation of a pixel array in accordance with one embodiment of the present invention.
Figure 1B:
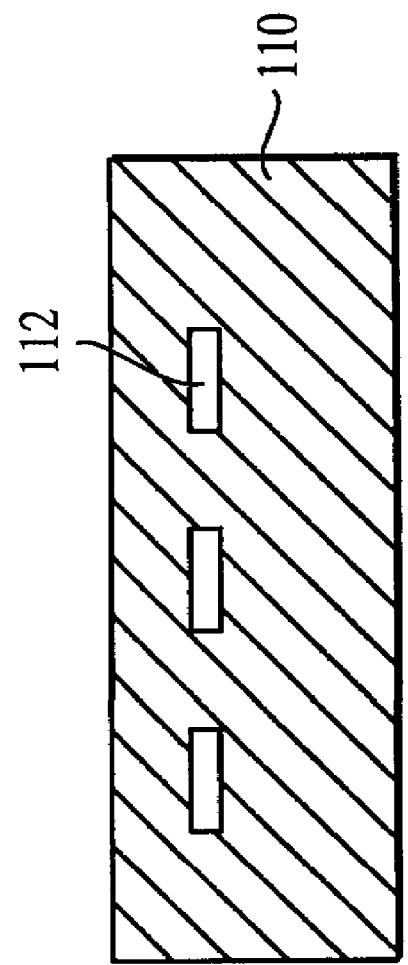

Now referring to the figures, where like reference numbers designate like elements, FIG. 1 depicts a semiconductor substrate 110 in and on which a plurality of photo diodes 112 have been fabricated. The substrate 110 may comprise integrated circuits and other semiconductor components that may be incorporated in a CMOS chip device. FIG. 1A depicts photo diodes 112 on the surface of the semiconductor substrate 110. In an alternate embodiment, FIG. 1B depicts photo diodes 112 beneath the surface of the substrate 110. Photo diodes 112 may be fabricated using conventional techniques and are shown to illustrate one environment of many in which the present invention may be employed.

The semiconductor photo diodes 112 of the present invention can mediate unidirectional current flow, as characteristic of diodes used in CMOS chip and imaging devices. For purposes of illustrating the invention, as depicted in FIGS. 1A–1B, photo diodes 112 are illustrated in a symmetric arrangement and orientation, with an intervening space separating each respective photo diode in substrate 110. It should be understood, however, that the invention is applicable to providing photo diodes in other arrangements and orientation, to be integrated with other components of a semiconductor device.

Figure 2A:
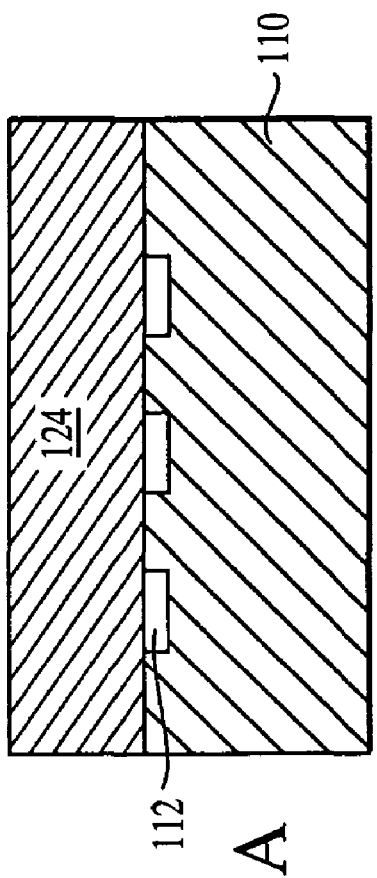
FIG. 2 depicts a schematic cross-sectional view of the FIG. 1 device at the beginning of the formation of a pixel array in accordance with the present invention and at an initial stage of processing.

The process for making the structures illustrated in FIGS. 9A and 9B will now be described with reference to FIGS. 2–9. FIG. 2A illustrates a substrate 110 along a cross-sectional view which is the same view as in FIG. 1. For exemplary purposes, the substrate 110 may be a silicon substrate. However, as noted above, the invention has equal application to other semiconductor substrates.

Figure 2B:
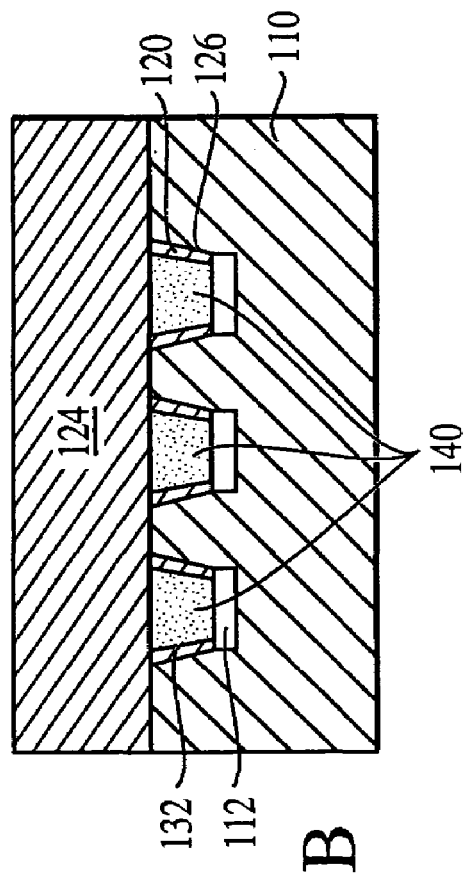

In another embodiment of the invention, FIG. 2B depicts in schematic manner openings which have been etched into substrate 110 and filled with photoconductive material 140. If the photo diodes 112 are beneath the surface of substrate 110, the first step in formation of a CMOS imaging device comprises etching away substrate 110 to form openings over each photo diodes 112, and to expose the upper surfaces of each photo diode 112 (not shown). This etching step may be formed by any conventional technique used for etching of semiconductor substrate materials. As illustrated in FIG. 2B, this etching procedure, which comprises removing a portion of the substrate 110, creates outer etched surfaces 126. These outer etched surfaces 126 mark the outer edges of the openings in which at least one sacrificial material 120 will be deposited within each opening over each respective photo diode 112.

In a preferred embodiment, the etched surfaces 126 are formed at an angle, to expose the upper surfaces of the photo diodes 112. Etching to form angled edges, as illustrated in FIG. 2B, may be performed by angled-trench etching, for example.

The openings over each photo diode 112 are then filled with at least one sacrificial material 120. The application of sacrificial material 120 may be performed using conventional techniques, including for example surface micromachining processes The sacrificial material may comprise any material that can readily decompose when heated, for example, polynorbornene or polycarbonate based materials. Other sacrificial materials, however, in addition to polynorbornene or polycarbonate based materials, can be used for the subject invention.

The sacrificial material 120 is then etched to remove at least a portion of the material 120 over the upper surfaces of the photo diodes 112, to form inner etched surfaces 132, as illustrated in FIG. 2B.

As further depicted in FIG. 2B, at least one photoconductive material 140 is then applied within the opening over each photo diode 112. The photoconductive material 140 may comprise any material that has a refractive index (n) greater than one (n>1) and acts as a conductor of light or that can propagate or transmit light to an underlying photo diode 112. For example, the photoconductive material 140 may comprise nitride (n=1.946) or silicon dioxide ($SiO_2$) (n=1.468) at 550 nm wavelength.

In another embodiment, the photoconductors are broadly drawn to deposition of any type of "glass" conductive material (or glass conductor), and preferably to glass conductors with a refractive index greater than the refractive index of at least one fluidic material between each adjacent photoconductor. The combined fluidic materials have a refractive index lower than the refractive index of each of said photoconductors. The one or more fluidic materials between each adjacent photoconductor may comprise any gaseous or non-gaseous fluid.

Each photoconductor formed may receive and propagate light within an interior space of the photoconductor to at least one photo diode, wherein said interior space is defined by the outer surfaces of the photoconductor. The outer surfaces of each photoconductor may be of any configuration, including substantially straight, substantially diagonal, or curved. The image pixel array of the invention is preferably formed wherein there is minimal space between the upper portions of each adjacent photoconductor.

In one embodiment, the outer perimeter of an upper portion of each photoconductor may comprise at least three substantially straight edges. Alternatively, the outer perimeter of an upper portion of each photoconductor may be polygonal, substantially square, pentagonal, hexagonal, or octagonal. A nitride liner may also be provided around an outer perimeter of each photoconductor. In another embodiment, the diameter of an upper portion of each photoconductor may be greater than the diameter at the base of each respective photoconductor.

As illustrated in FIG. 2A, at least one sacrificial material 124 is then applied over the upper surfaces of the photo diodes 112 and substrate 110. Alternatively, as illustrated in FIG. 2B, the sacrificial material 124 can be applied over the upper surfaces of the etched sacrificial material 120, the deposits of photoconductive material 140, and the upper surface of substrate 110.

Figure 3A:
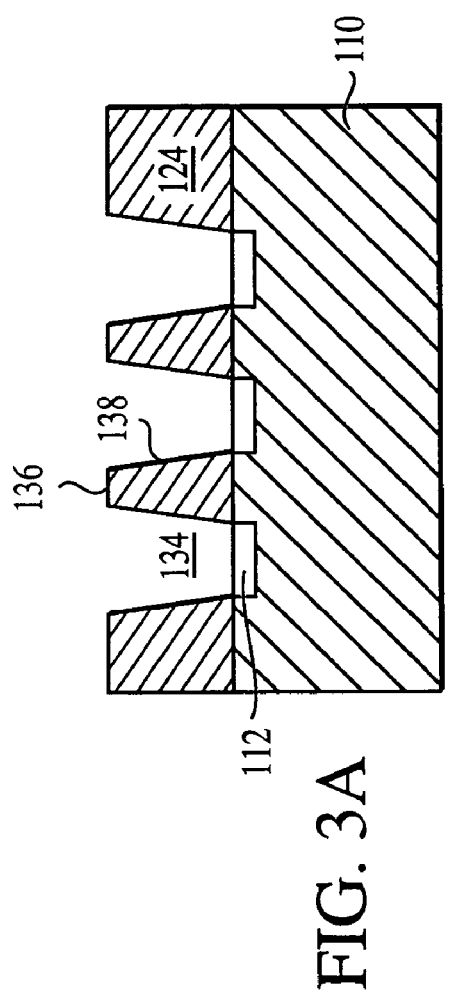
FIG. 3 depicts a schematic cross-sectional view of the FIG. 1 device formed at a stage of processing subsequent to that shown in FIG. 2.

As depicted in schematic form in FIG. 3A, the step of etching and removing the sacrificial material 124 from over each of the plurality of photo diodes 112 comprises forming an etched opening 134 over each photo diode 112. In a preferred embodiment, there is minimal space along the length of an upper surface 136 of sacrificial material 124 that separates the upper portions of each adjacent opening 134.

Although FIG. 3A depicts etched opening 134 as having substantially diagonal sidewall surfaces 138, it must be noted that the etched opening 134 is not limited in shape or dimensions to the depiction in the accompanying figures, but instead can be formed to any shape and dimensions desired. The etched opening 134 can, alternatively, have either concave or convex curved sidewall surfaces 138 that are substantially orthogonal to the generally horizontal planar surface of an upper surface 136 of sacrificial material 124.

Figure 3B:
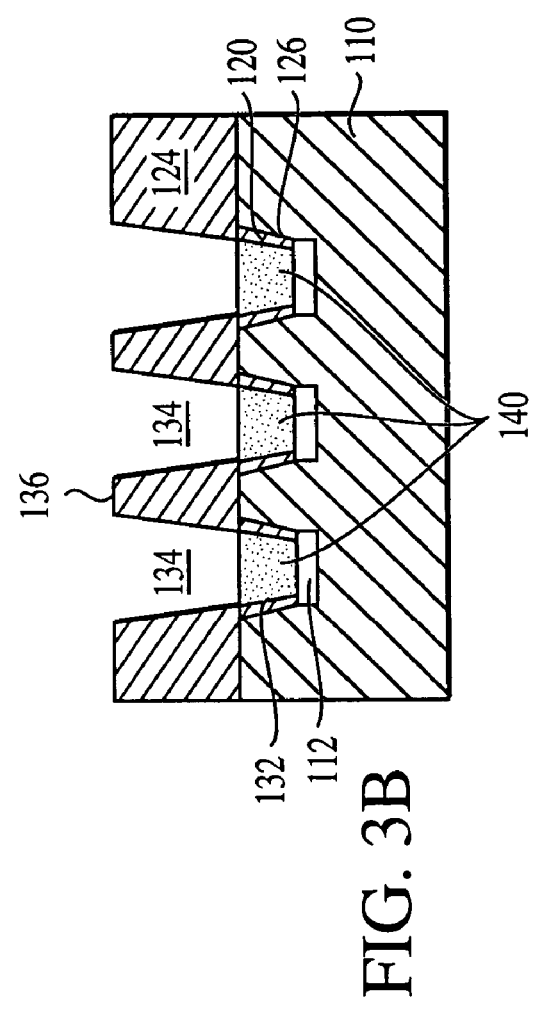

FIG. 3B illustrates an etched opening 134 formed over each deposit of photoconductive material 140, wherein each deposit of photoconductive material 140 has been deposited over each photo diode 112. As depicted in FIG. 3B, it is desired to provide photo diodes 112 in an aligned manner to produce photoconductor arrays for maximal light absorption.

FIG. 4A illustrates photoconductors 144 formed in accordance with one aspect of the present invention. After etched openings are formed, as depicted in FIGS. 3A and 3B, photoconductive material is deposited or filled within each opening 134 to form photoconductors 144, with photoconductive layer 148. The photoconductors 144 may comprise any material that has a refractive index greater than one (n>1) and acts as a conductor of light or that can propagate or transmit light to an underlying photo diode 112. For example, the photoconductors 144 may comprise either nitride (n=1.946) or silicon dioxide ($SiO_2$) (n=1.468) at 550 nm wavelength. Although in the preferred embodiment of the invention, nitride or silicon dioxide is used to form photoconductors 144, those skilled in the art will recognize that other compounds may be employed in place of nitride or silicon dioxide.

Nitride can act as a barrier in preventing contaminants from reaching the underlying photo diodes 112 or other integrated circuitry below the photo diodes, including circuitry integrated with the CMOS imaging device.

In one embodiment, as depicted in FIGS. 4A and 4B, the diameter of an upper portion of a photoconductor 144 is greater than the diameter of a base portion of the same photoconductor 144 formed over each photo diode 112. Although FIGS. 4A and 4B depict photoconductors 144 as having substantially diagonal sidewall surfaces, it must be noted that the photoconductors 144 are not limited in shape or dimensions to the depiction in the accompanying figures, but instead can be formed to any shape and dimensions desired. For example, photoconductors 144 can have either concave or convex curved sidewall surfaces that are substantially orthogonal to the generally horizontal planar surface of an upper surface 136 of sacrificial material 124.

At this stage, after forming photoconductors 144, chemical mechanical planarization (CMP) or other planarization may be used to planarize a photoconductive layer 148.

Figure 5A:
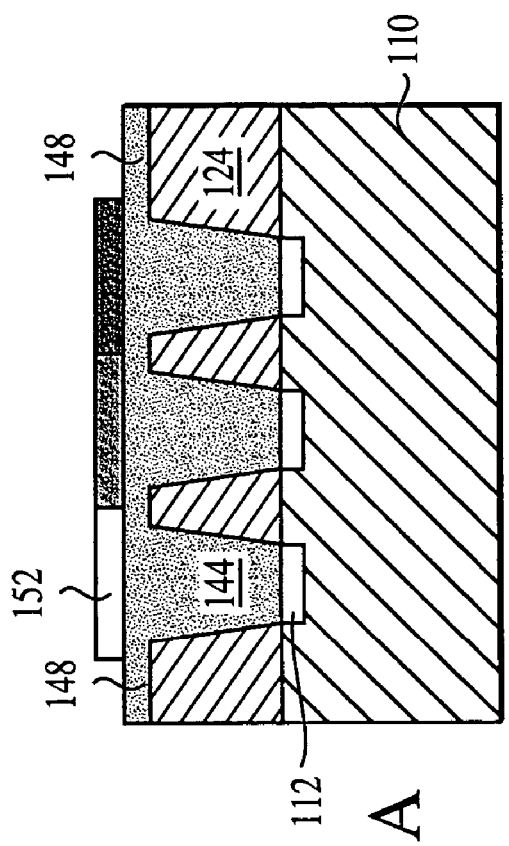
FIG. 5 depicts a schematic cross-sectional view of the FIG. 1 device formed at a stage of processing subsequent to that shown in FIG. 4.
Figure 5B:
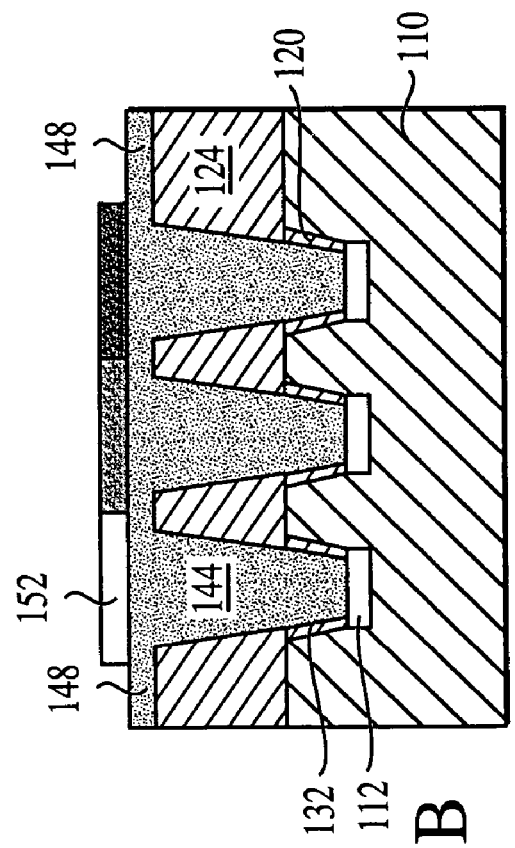

As illustrated in FIGS. 5A and 5B, a color resist layer 152, comprised of different color filters, is formed over photoconductive layer 148 and photoconductors 144. A single color filter is formed over each photoconductor 144. Since white light comprises red, green and blue light, it is preferred to form color resist layer 152 comprised of red, green and blue filters. In the case of a red filter placed over a photoconductor 144, for example, the red filter will absorb all colors of light except red, and thus only red light will pass through to the underlying photo diode 112. Any combination or array of color filters can be formed for color processing and imaging by a CMOS imaging device formed in accordance with the present invention.

In another embodiment (not shown), a color resist layer 152 can be formed over photoconductors 144 but prior to, and beneath, photoconductive layer 148. In this manner, photoconductive layer 148 is formed subsequent to formation of color resist layer 152, and overlying each color filter comprising color resist layer 152.

A separate nitride liner (not shown) can also be formed along the sidewall surfaces of each photoconductor 144 to guard against diffusion of impurities into the wafer or substrate 110 from the color filter materials comprising the color resist layer 152.

Figure 6A:
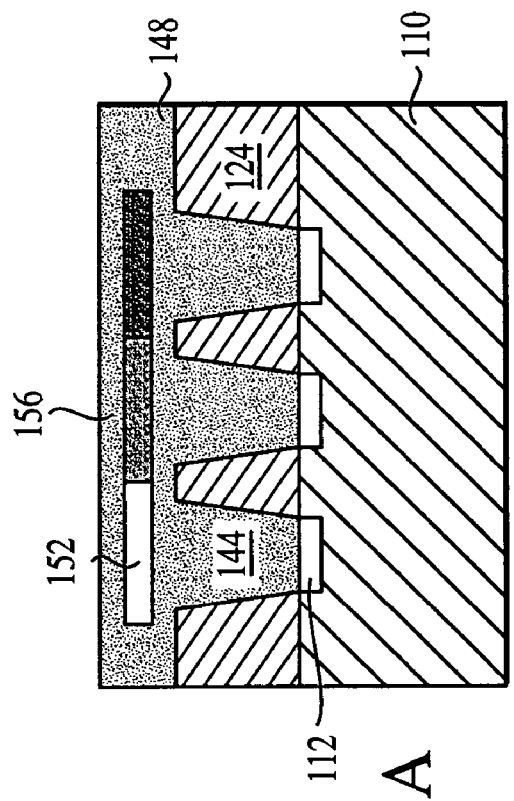
FIG. 6 depicts a schematic cross-sectional view of the FIG. 1 device formed at a stage of processing subsequent to that shown in FIG. 5.
Figure 6B:
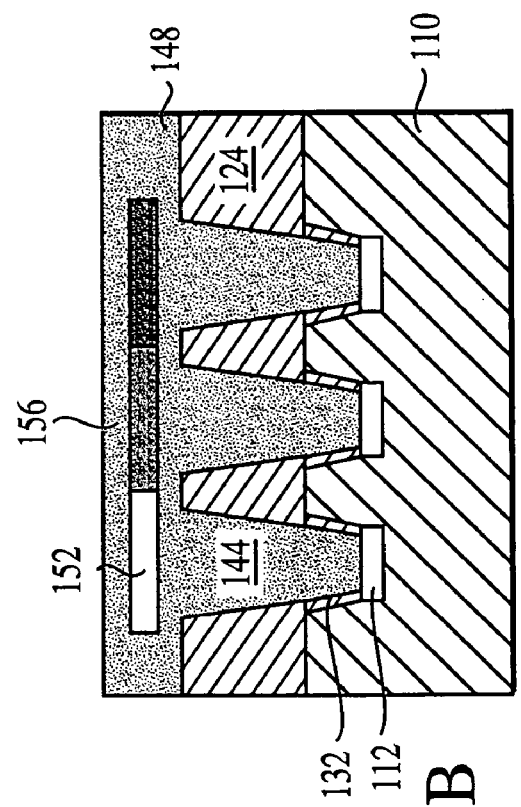

Turning to FIG. 6, FIGS. 6A and 6B illustrate the present invention, at a stage subsequent to that shown in FIGS. 5A and 5B, respectively, after deposition of at least one photoconductive layer 156. Photoconductive layer 156 may be formed using one or more of the photoconductive materials used in forming photoconductors 144, including for example nitride or silicon dioxide. Photoconductive layer 156 can be formed over color resist layer 152 and provides several advantages. For example, photoconductive layer 156 protects color resist layer 152 against damage during subsequent stages of CMOS imager formation, including but not limited to protection during backgrind, mount, saw, and die attach processing steps.

Figure 7A:
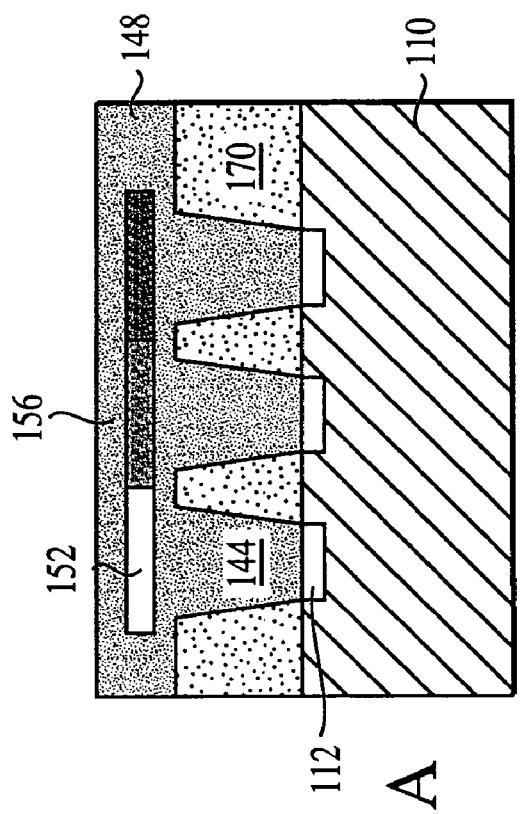
FIG. 7 depicts a schematic cross-sectional view of the FIG. 1 device formed at a stage of processing subsequent to that shown in FIG. 6.
Figure 7B:
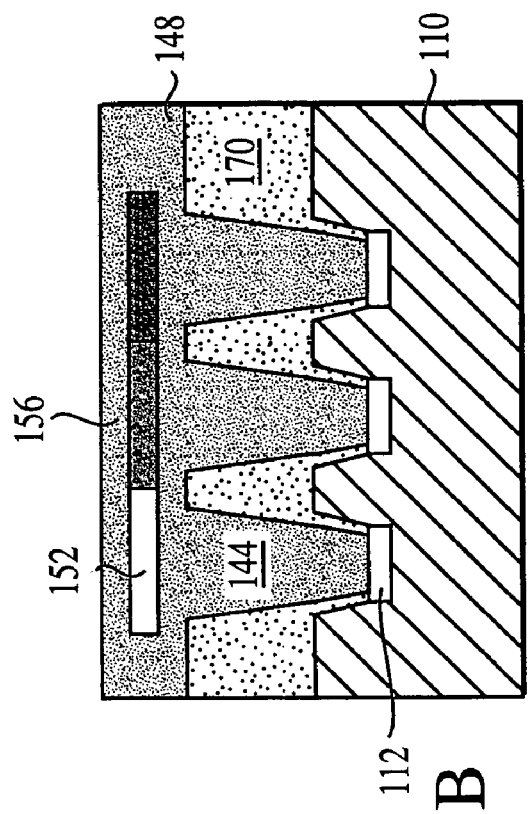

As illustrated schematically in FIGS. 7A and 7B, the sacrificial material 124 is then "decomposed" with a selection of proper materials to produce volatile products 170. During the decomposition process, any materials and conditions can be used that effectuate decomposition of the sacrificial material 124. The decomposition may be performed at temperatures anywhere in the range of about 125° C. to about 200° C.

Addition of the proper decomposition materials, at a given temperature, causes sacrificial material 124 to produce volatile products 170. At this stage, the volatile products 170 of the decomposition then diffuse laterally and evaporate away from the silicon substrate and CMOS imager device. In another embodiment, an opening or "escape route" is formed for the removal of the volatile products 170.

Since color resist layer 152 can begin to decompose at high temperatures, for example, at approximately 250° C., it is preferred to decompose the sacrificial material 124 before the color resist layer 152 is formed.

Figure 8A:
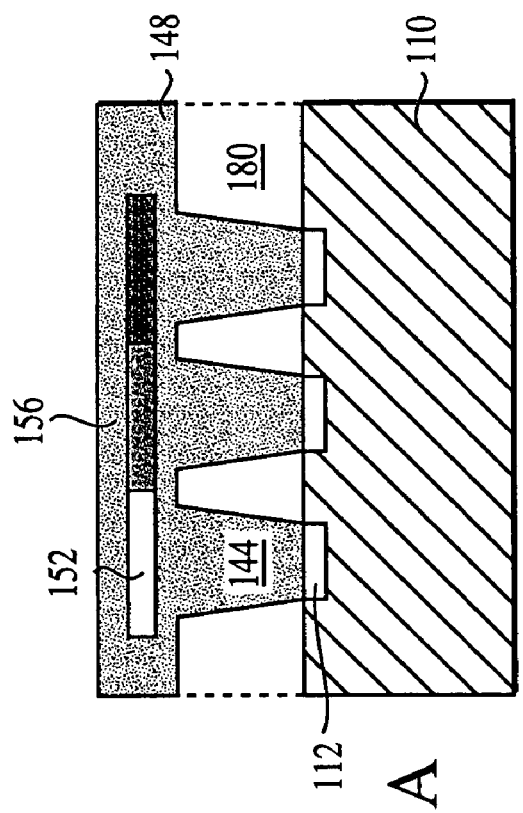
FIG. 8 depicts a schematic cross-sectional view of the FIG. 1 device formed at a stage of processing subsequent to that shown in FIG. 7.
Figure 8B:
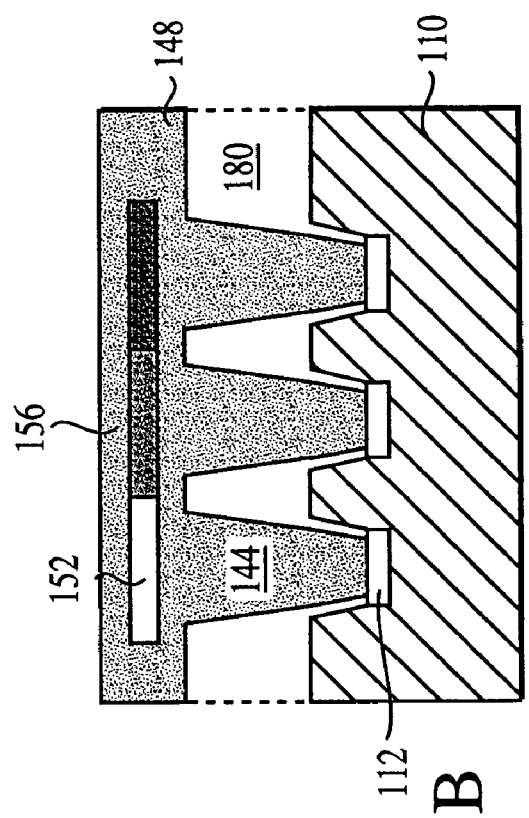

FIGS. 8A and 8B illustrate in schematic form, after completion of the decomposition process, the completed CMOS imager with photoconductors 144 for light transmission to photo diodes 112. As depicted in FIGS. 8A and 8B, the space previously occupied by the volatile products 170 is now occupied by at least one low refractive index material 180, for example, air (n=1). Other low refractive index materials 180 may also be used, as long as the refractive index (n value) of each photoconductor 144 is greater than the n value for each low refractive index material 180. The present invention therefore contemplate the use of other low refractive index materials besides air that fills the spaces between adjacent photoconductors 144. For example, at least one gaseous and/or non-gaseous fluidic materials may be used between adjacent photoconductors 144, as long as the refractive index (n value) of each photoconductor 144 is greater than the combined n value for the one or more gaseous and/or non-gaseous fluidic materials.

As depicted in FIGS. 9A and 9B, after removal of the volatile products 170 by evaporation and diffusion, each photoconductor 144 is separated by at least one low refractive index material 180. Since the refractive index (n) of each photoconductor 144 is greater than the refractive index (n) for each low refractive index material 180, light 190 entering each photoconductor 144 below certain angles will propagate within each photoconductor 144 to a photo diode 112 by total internal reflection. As depicted schematically in FIGS. 9A and 9B, this total internal reflection results in the "conduction" of light within each photoconductor 144 to a photo diode 112. Although one configuration of the invention is depicted in schematic form in FIGS. 9A and 9B, photoconductors 144 may be formed in any other configuration that results in propagation or "conduction" of light to photo diodes 112.

Figure 10:
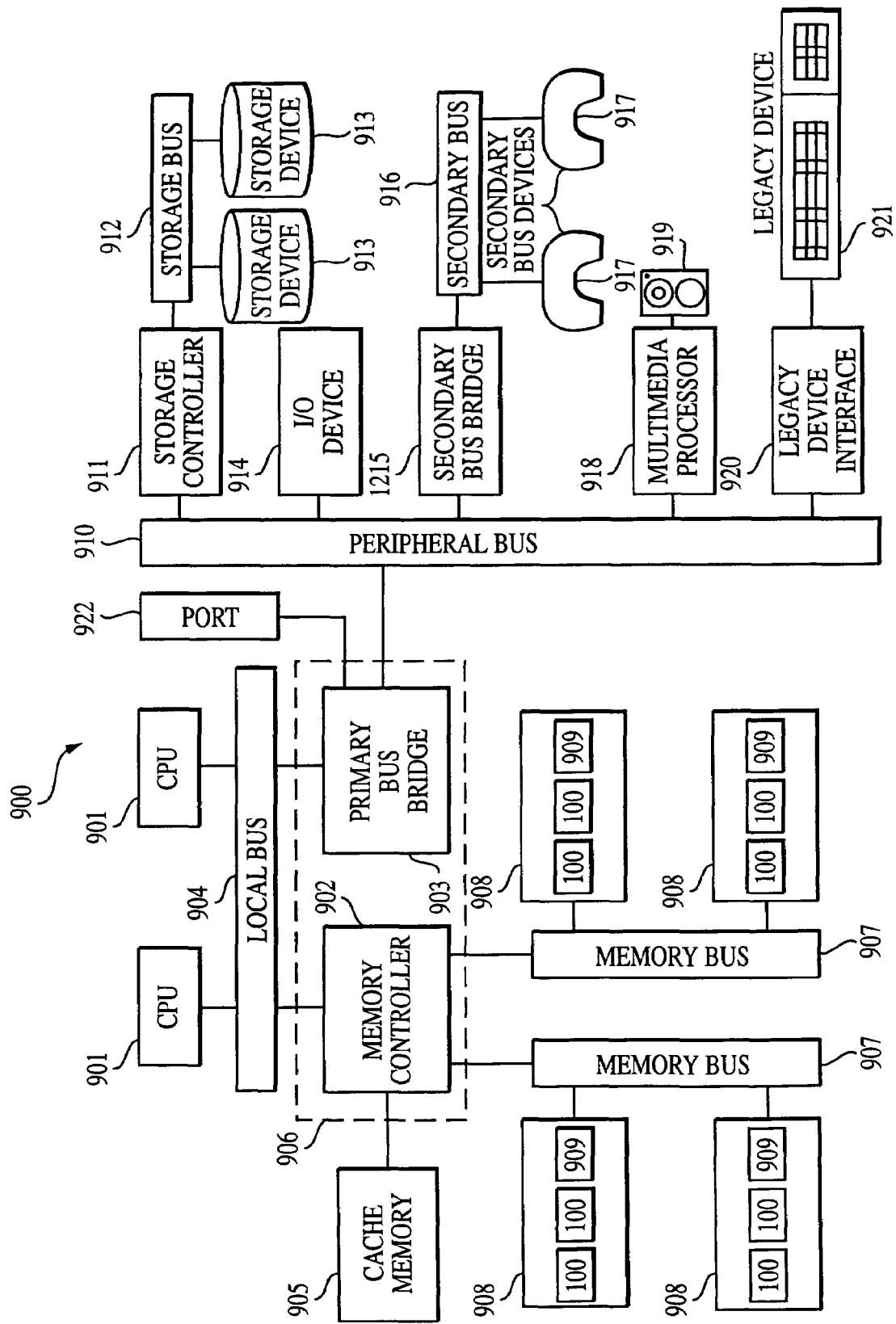
FIG. 10 illustrates a schematic diagram of a computer processor system incorporating a CMOS imaging device fabricated according to the present invention, and wherein the CMOS imaging device contains one or more pixel arrays formed in accordance with the present invention.

FIG. 10 illustrates an exemplary processing system 900 which may utilize a memory device 100. Any one of the electronic components shown in FIG. 10, including CPU 901 and memory device 100, may be fabricated as an integrated circuit for use in processing images formed in accordance with the CMOS imaging devices and methods of the present invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 100. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also be coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 10 is only an exemplary processing system with which the invention may be used. While FIG. 10 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The photoconductor arrays and devices of the present invention, when coupled to a pixel processor, for example, may be implemented in digital cameras and video processors and recorders. Modifications may include, for example, elimination of unnecessary components, addition of specialized devices or circuits, and/or integration of a plurality of devices.

While the invention is preferably directed to methods for forming photoconductors and photoconductor arrays and devices, and the resulting structures, one skilled in the art will recognize that the invention can be used to form any type of photoconductor array for integration with one or more processing components in a semiconductor device.

The present invention offers advantages over previous CMOS imaging technology, including, but not limited to, elimination of the need to use a ceramic package or lid attach in forming the CMOS imager. The instant methods for producing a CMOS imager also involve minimal power loss. Since no lens is required, the present invention eliminates concerns about lens radius limitations and about damaging lenses during die attach, backgrind, and mounting processes. The present invention also provides little or no cross talk between photo diodes.

It should again be noted that although the invention has been described with specific reference to CMOS imaging devices comprising a structure for transmitting light to a photo diode, the invention has broader applicability and may be used in any CMOS imaging apparatus. Similarly, the process described above is but one method of many that may be used. The above description and drawings illustrate preferred embodiments which achieve the objects, features and advantages of the present invention. Although certain advantages and preferred embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Letters Patent of the United States is:

1. A CMOS imaging device, comprising:
    a plurality of photo diodes;
    a plurality of photoconductors formed over said plurality of photo diodes, each photoconductor being capable of receiving and propagating light within an interior space of each said photoconductor to at least one of said photo diodes, said interior space defined by the outer surfaces of each said photoconductor; and
    at least one fluidic material between each said photoconductor, said at least one fluidic material surrounding at least a lower portion of each of said photoconductors, said at least one fluidic material having a lower refractive index as compared to the refractive index of each said photoconductor.

2. The CMOS imaging device of claim 1, wherein each said photoconductor receives and propagates light to a single corresponding photo diode.

3. The CMOS imaging device of claim 1, wherein each said photoconductor comprises a material selected from the group consisting of silicon dioxide and nitride.

4. The CMOS imaging device of claim 1, wherein each said photoconductor comprises silicon dioxide and nitride.

5. The CMOS imaging device of claim 1, wherein said outer surfaces of each said photoconductor are selected from the group consisting of substantially straight, substantially diagonal and curved outer surfaces.

6. The CMOS imaging device of claim 1, wherein said at least one fluidic material comprises a non-gaseous fluid.

7. The CMOS imaging device of claim 1, wherein there is minimal space between the upper portions of each adjacent photoconductor.

8. The CMOS imaging device of claim 1, wherein the outer perimeter of an upper portion of each said photoconductor comprises at least three substantially straight edges.

9. The CMOS imaging device of claim 8, wherein said outer perimeter is selected from the group consisting of a polygonal, substantially square, substantially pentagonal, substantially hexagonal, and substantially octagonal outer perimeter.

10. The CMOS imaging device of claim 1, wherein a nitride liner is provided around an outer perimeter of each said photoconductor.

11. The CMOS imaging device of claim 1, wherein the diameter of an upper portion of each said photoconductor is greater than the diameter at the base of each respective photoconductor.

12. A CMOS imaging device, comprising:
    a plurality of photo diodes;
    a plurality of photoconductors formed over said plurality of photo diodes, each photoconductor being capable of receiving and propagating light within an interior space of each said photoconductor to at least one of said photo diodes, said interior space defined by the outer surfaces of each said photoconductor; and
    at least one fluidic material between each said photoconductor, said at least one fluidic material having a lower refractive index as compared to the refractive index of each said photoconductor,
    wherein said at least one fluidic material is a gas.

13. The CMOS imaging device of claim 12, wherein said at least one fluidic material is air.

14. A CMOS imaging device, comprising:
    a semiconductor substrate;
    a plurality of photo diodes at or beneath an upper surface of said semiconductor substrate;

a plurality of photoconductors formed over said plurality of photo diodes, each photoconductor being capable of receiving and propagating light within an interior space of each said photoconductor to at least one of said photo diodes, said interior space defined by the outer surfaces of each said photoconductor; and at least one fluidic material between each said photoconductor, said at least one fluidic material surrounding at least a lower portion of each of said photoconductors, said at least one fluidic material having a lower refractive index as compared to the refractive index of each said photoconductor.

15. An image pixel array in a CMOS imaging device, comprising:

a plurality of photoconductors formed over a plurality of photo diodes, said photo diodes formed at or beneath the upper surface of a semiconductor device, each photoconductor being capable of receiving and propagating light within an interior space of each said photoconductor to at least one of said photo diodes, said interior space defined by the outer surfaces of each said photoconductor;

a color filter formed over each said photoconductor; and at least one fluidic material between each said photoconductor, said at least one fluidic material surrounding at least a lower portion of each of said photoconductors, said at least one fluidic material having a lower refractive index as compared to the refractive index of each said photoconductor.

16. The image pixel array of claim 15, wherein each said photoconductor receives and propagates light to a single corresponding photo diode.

17. The image pixel array of claim 15, wherein each said photoconductor comprises a material selected from the group consisting of silicon dioxide and nitride.

18. The image pixel array of claim 15, wherein each said photoconductor comprises silicon dioxide and nitride.

19. The image pixel array of claim 15, wherein said outer surfaces of each said photoconductor are selected from the group consisting of substantially straight, substantially diagonal and curved outer surfaces.

20. The image pixel array of claim 15, wherein said at least one fluidic material comprises a non-gaseous fluid.

21. The image pixel array of claim 15, wherein there is minimal space between the upper portions of each adjacent photoconductor.

22. The image pixel array of claim 15, wherein the outer perimeter of an upper portion of each said photoconductor comprises at least three substantially straight edges.

23. The image pixel array of claim 22, wherein said outer perimeter is selected from the group consisting of a polygonal, substantially square, substantially pentagonal, substantially hexagonal, and substantially octagonal outer perimeter.

24. The image pixel array of claim 15, wherein a nitride liner is provided around an outer perimeter of each photoconductor.

25. The image pixel array of claim 15, wherein the diameter of an upper portion of each said photoconductor is greater than the diameter at the base of each respective photoconductor.

26. An image pixel array in a CMOS imaging device, comprising:

a plurality of photoconductors formed over a plurality of photo diodes, said photo diodes formed at or beneath the upper surface of a semiconductor device, each photoconductor being capable of receiving and propagating light within an interior space of each said photoconductor to at least one of said photo diodes, said interior space defined by the outer surfaces of each said photoconductor;

a color filter formed over each said photoconductor; and at least one fluidic material between each said photoconductor, said at least one fluidic material having a lower refractive index as compared to the refractive index of each said photoconductor, wherein said at least one fluidic material is a gas.

27. The image pixel array of claim 26, wherein said at least one fluidic material is air.

28. A CMOS imager system, comprising:

(i) a processor; and (ii) a CMOS imaging device coupled to said processor, said CMOS imaging device comprising:

a semiconductor substrate;

a plurality of photo diodes at or beneath an upper surface of said semiconductor substrate;

a plurality of photoconductors formed over said plurality of photo diodes, each photoconductor being capable of receiving and propagating light within an interior space of each said photoconductor to at least one of said photo diodes, said interior space defined by the outer surfaces of each said photoconductor;

a color filter formed over each said photoconductor; and at least one fluidic material between each said photoconductor, said at least one fluidic material surrounding at least a lower portion of each of said photoconductors, said at least one fluidic material having a lower refractive index as compared to the refractive index of each said photoconductor.

29. The CMOS imager system of claim 28, wherein each said photoconductor receives and propagates light to a single corresponding photo diode.

30. The CMOS imager system of claim 28, wherein each said photoconductor comprises a material selected from the group consisting of silicon dioxide and nitride.

31. The CMOS imager system of claim 28, wherein each said photoconductor comprises silicon dioxide and nitride.

32. The CMOS imager system of claim 28, wherein the outer surfaces of each said photoconductor are selected from the group consisting of substantially straight, substantially diagonal and curved outer surfaces.

33. The CMOS imager system of claim 28, wherein said at least one fluidic material comprises a non-gaseous fluid.

34. The CMOS imager system of claim 28, wherein there is minimal space between the upper portions of each adjacent photoconductor.

35. The CMOS imager system of claim 28, wherein the outer perimeter of an upper portion of each said photoconductor comprises at least three substantially straight edges.

36. The CMOS imager system of claim 35, wherein said outer perimeter is selected from the group consisting of a polygonal, substantially square, substantially pentagonal, substantially hexagonal, and substantially octagonal outer perimeter.

37. The CMOS imager system of claim 28, wherein a nitride liner is provided around an outer perimeter of each said photoconductor.

38. The CMOS imager system of claim 28, wherein the diameter of an upper portion of each said photoconductor is greater than the diameter at the base of each respective photoconductor.

39. A CMOS imager system, comprising:
(i) a processor; and
(ii) a CMOS imaging device coupled to said processor, said CMOS imaging device comprising:
a semiconductor substrate;
a plurality of photo diodes at or beneath an upper surface of said semiconductor substrate;
a plurality of photoconductors formed over said plurality of photo diodes, each photoconductor being capable of receiving and propagating light within an interior space of each said photoconductor to at least one of said photo diodes, said interior space defined by the outer surfaces of each said photoconductor;
a color filter formed over each said photoconductor; and
at least one fluidic material between each said photoconductor, said at least one fluidic material having a lower refractive index as compared to the refractive index of each said photoconductor,
wherein said at least one fluidic material is a gas.

40. The CMOS imager system of claim 39, wherein said at least one fluidic material is air.

* * * * *

UNITED STATES PATENT AND TRADEMARK OFFICE
CERTIFICATE OF CORRECTION

PATENT NO.   : 6,995,442 B2   Page 1 of 1
DATED        : February 7, 2006
INVENTOR(S)  : Tongbi Jiang et al.

It is certified that error appears in the above-identified patent and that said Letters Patent is hereby corrected as shown below:

Column 7,
Line 56, "contemplate" should read -- contemplates --;
Line 59, "materials" should read -- material --;

Column 8,
Line 22, "coupled the" should read -- coupled to the --;
Line 43, "include" should read -- includes --;
Lines 53-54, "an miscellaneous" should read -- a miscellaneous --;
Line 55, "an legacy" should read -- a legacy --;
Line 66, "an local" should read -- a local --;

Column 9,
Line 3, "an universal" should read -- a universal --;
Line 4, "via to the" should read -- via the --;
Line 7, "to one additional" should read -- to additional --; and
Line 26, "system" should read -- systems --.

Signed and Sealed this

Thirtieth Day of May, 2006

JON W. DUDAS
*Director of the United States Patent and Trademark Office*